US011094627B2

(12) United States Patent
Machkaoutsan et al.

(10) Patent No.: US 11,094,627 B2
(45) Date of Patent: Aug. 17, 2021

(54) METHODS USED IN FORMING A MEMORY ARRAY COMPRISING STRINGS OF MEMORY CELLS

(71) Applicant: Micron Technology, Inc., Boise, ID (US)

(72) Inventors: Vladimir Machkaoutsan, Wezemaal (BE); Pieter Blomme, Heverlee (BE); Emilio Camerlenghi, Bergamo (IT); Justin B. Dorhout, Boise, ID (US); Jian Li, Boise, ID (US); Ryan L. Meyer, Boise, ID (US); Paolo Tessariol, Arcore (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/663,683

(22) Filed: Oct. 25, 2019

(65) Prior Publication Data

US 2021/0125919 A1 Apr. 29, 2021

(51) Int. Cl.
*H01L 27/11582* (2017.01)
*H01L 27/11556* (2017.01)
(Continued)

(52) U.S. Cl.
CPC .... *H01L 23/5226* (2013.01); *H01L 21/31111* (2013.01); *H01L 23/5283* (2013.01);
(Continued)

(58) Field of Classification Search
CPC ......... H01L 27/11556; H01L 27/11582; H01L 27/11519; H01L 27/11565; H01L 27/11524; H01L 27/1157
See application file for complete search history.

(56) References Cited

U.S. PATENT DOCUMENTS 8,492,278 B2 7/2013 Good et al.
8,735,216 B2 3/2014 Liu et al.
(Continued)

OTHER PUBLICATIONS

U.S. Appl. No. 16/728,962, filed Dec. 27, 2019, by Scarbrough et al.
(Continued)

*Primary Examiner* — Younes Boulghassoul
(74) *Attorney, Agent, or Firm* — Wells St. John P.S.

(57) ABSTRACT

A memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. First dummy pillars in the memory blocks extend through at least a majority of the insulative tiers and the conductive tiers through which the channel-material strings extend. Second dummy pillars are laterally-between and longitudinally-spaced-along immediately-laterally-adjacent of the memory blocks. The second dummy pillars extend through at least a majority of the insulative tiers and the conductive tiers through which the operative channel-material strings extend laterally-between the immediately-laterally-adjacent memory blocks. Other embodiments, including method, are disclosed.

20 Claims, 14 Drawing Sheets

(51) Int. Cl.
  *H01L 27/1157*    (2017.01)
  *H01L 27/11524*   (2017.01)
  *H01L 21/311*     (2006.01)
  *H01L 23/522*     (2006.01)
  *H01L 23/528*     (2006.01)

(52) U.S. Cl.
  CPC .... *H01L 27/1157* (2013.01); *H01L 27/11524* (2013.01); *H01L 27/11556* (2013.01); *H01L 27/11582* (2013.01)

(56) References Cited

U.S. PATENT DOCUMENTS

| | | | |
|---|---|---|---|
| 8,980,752 | B2 | 3/2015 | Good et al. |
| 9,786,673 | B1 * | 10/2017 | Cho ................. H01L 27/11582 |
| 9,893,083 | B1 | 2/2018 | Wang et al. |
| 10,014,309 | B2 | 7/2018 | Dorhout et al. |
| 10,381,377 | B2 | 8/2019 | Wang et al. |
| 10,388,665 | B1 | 8/2019 | Xie et al. |
| 2008/0014761 | A1 | 1/2008 | Bhatia et al. |
| 2011/0298013 | A1 * | 12/2011 | Hwang ................. H01L 27/088 257/208 |
| 2012/0052672 | A1 * | 3/2012 | Nakanishi ......... H01L 27/11582 438/591 |
| 2012/0098050 | A1 | 4/2012 | Shim et al. |
| 2013/0009236 | A1 | 1/2013 | Lee et al. |
| 2013/0140623 | A1 | 6/2013 | Lee et al. |
| 2015/0206900 | A1 * | 7/2015 | Nam ................. H01L 27/11582 257/326 |
| 2015/0318301 | A1 * | 11/2015 | Lee ................... H01L 27/11582 257/324 |
| 2015/0340377 | A1 * | 11/2015 | Lee ................... H01L 27/11556 257/314 |
| 2016/0204117 | A1 | 7/2016 | Liu et al. |
| 2016/0268302 | A1 | 9/2016 | Lee et al. |
| 2016/0343726 | A1 * | 11/2016 | Yune ..................... G06F 3/0656 |
| 2017/0148805 | A1 | 5/2017 | Nishikawa et al. |
| 2017/0278859 | A1 | 9/2017 | Sharangpani et al. |
| 2018/0047739 | A1 | 2/2018 | Dorhout et al. |
| 2018/0130814 | A1 * | 5/2018 | Lee ................... H01L 27/11568 |
| 2018/0261615 | A1 * | 9/2018 | Minemura ........ H01L 27/11524 |
| 2018/0294273 | A1 * | 10/2018 | Liao ................. H01L 27/11582 |
| 2018/0342528 | A1 * | 11/2018 | Lee ................... H01L 27/11519 |
| 2019/0019724 | A1 | 1/2019 | Cheng et al. |
| 2019/0067182 | A1 * | 2/2019 | Lee ................... H01L 23/53295 |
| 2019/0088671 | A1 * | 3/2019 | Greenlee ........... H01L 27/11582 |
| 2019/0237476 | A1 * | 8/2019 | Lee ................... H01L 27/11582 |
| 2019/0312054 | A1 * | 10/2019 | Yun ................... H01L 27/11565 |
| 2019/0363100 | A1 * | 11/2019 | Lee ....................... H01L 23/528 |
| 2020/0098781 | A1 * | 3/2020 | Xiao ................. H01L 27/11548 |
| 2020/0127005 | A1 * | 4/2020 | Otsu ................. H01L 27/11565 |
| 2020/0194373 | A1 | 6/2020 | Baek et al. |
| 2020/0295031 | A1 | 9/2020 | Lue |
| 2020/0312863 | A1 | 10/2020 | Iwai et al. |
| 2020/0388629 | A1 * | 12/2020 | Lee ................... H01L 27/11582 |
| 2021/0043647 | A1 * | 2/2021 | Kim ................... H01L 27/11573 |

OTHER PUBLICATIONS

U.S. Appl. No. 16/739,581, filed Jan. 10, 2020, by Tiwari.
Jang et al., "Vertical Cell Array using TCAT (Terabit Cell Array Transistor) Technology for Ultra High Density NAND Flash Memory", IEEE, Symposium on VLSI Technology Digest of Technical Papers, United States, 2009, pp. 192-193.
U.S. Appl. No. 16/545,375, filed Aug. 20, 2019 by Zhang et al.
U.S. Appl. No. 16/550,238, filed Aug. 25, 2019 by Hu et al.
U.S. Appl. No. 16/550,244, filed Aug. 25, 2019 by Tessariol et al.
U.S. Appl. No. 16/550,250, filed Aug. 25, 2019 by Greenlee et al.
U.S. Appl. No. 16/599,856, filed Oct. 11, 2019 by Billingsley et al.
U.S. Appl. No. 16/550,252, filed Aug. 25, 2019 by Xu et al.
U.S. Appl. No. 16/657,498, filed Oct. 18, 2019 by King et al.
U.S. Appl. No. 16/664,618, filed Oct. 25, 2019 by Hu et al.

\* cited by examiner

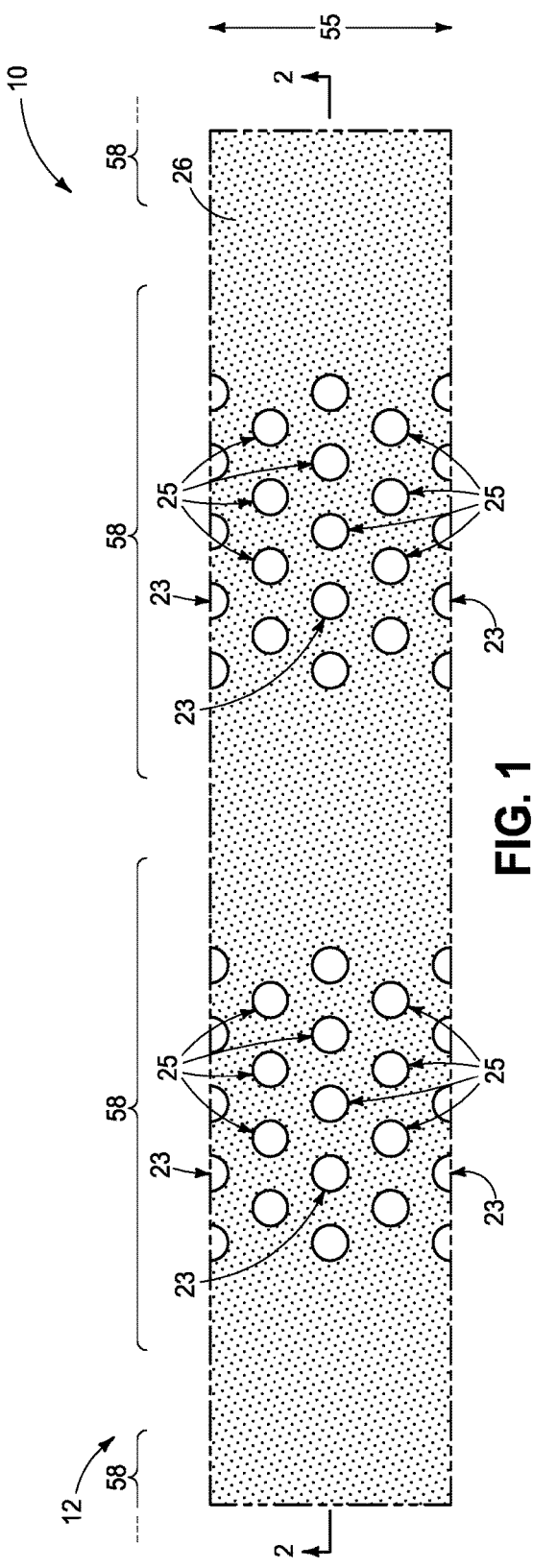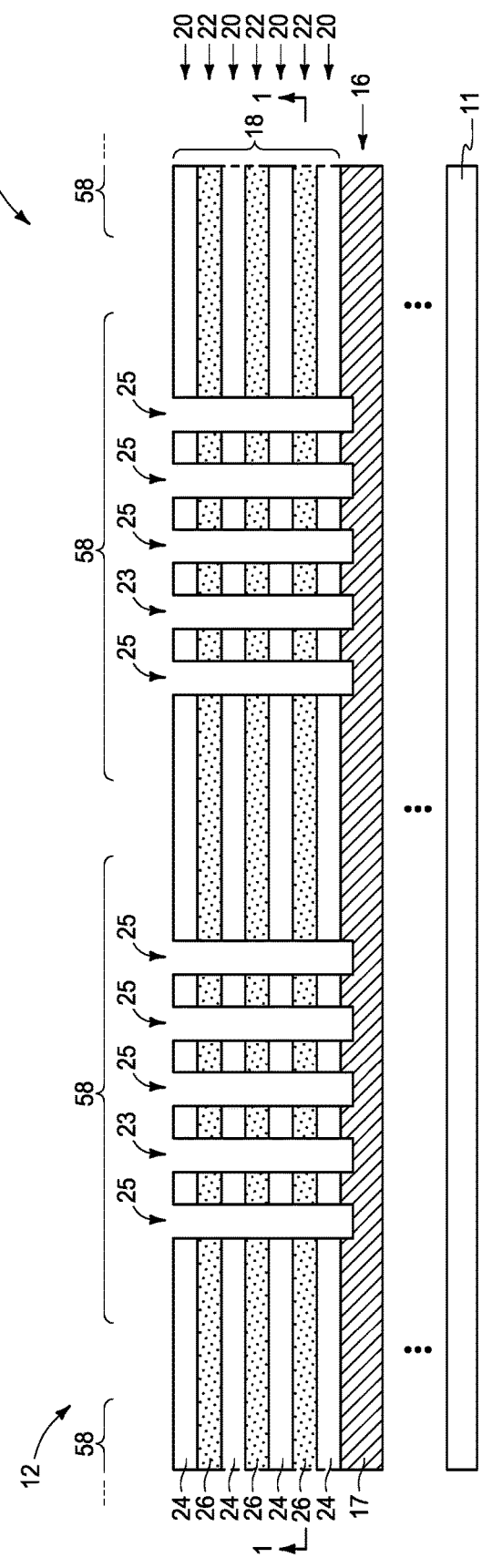

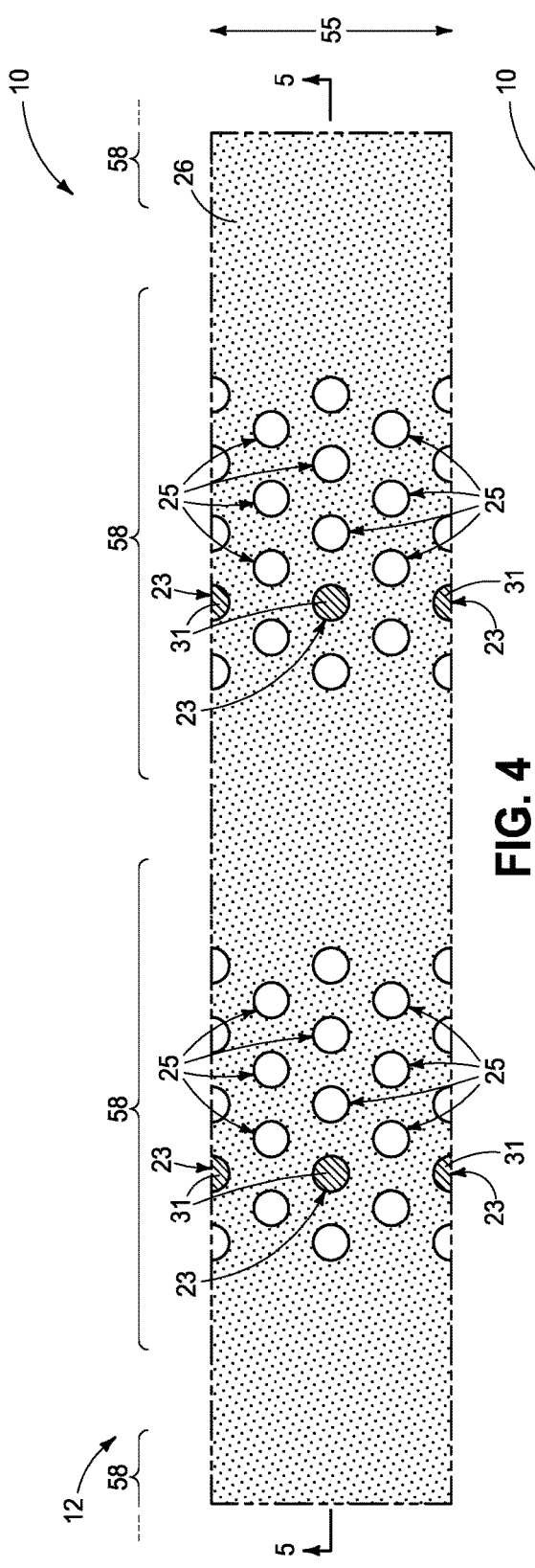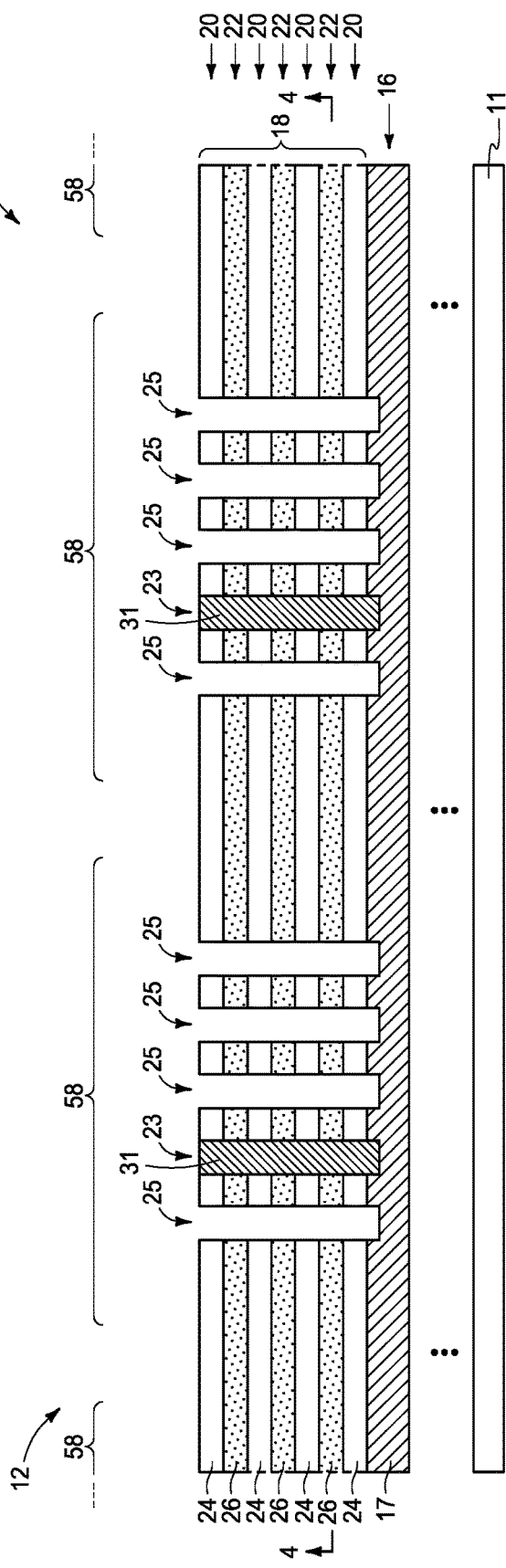

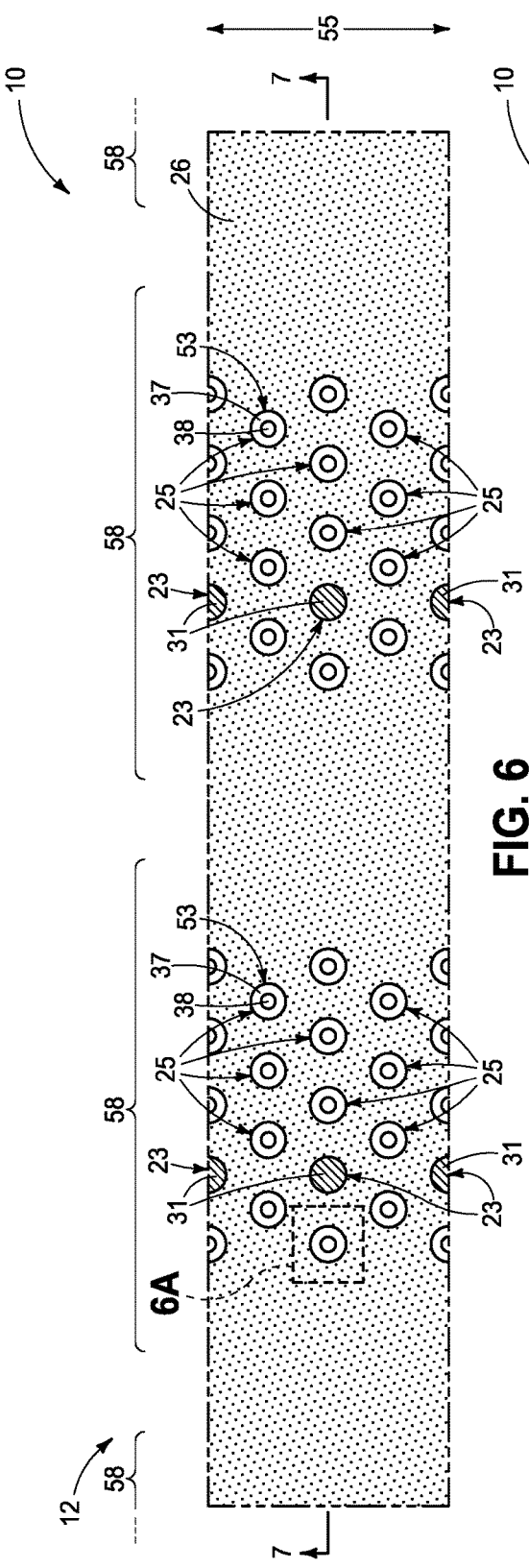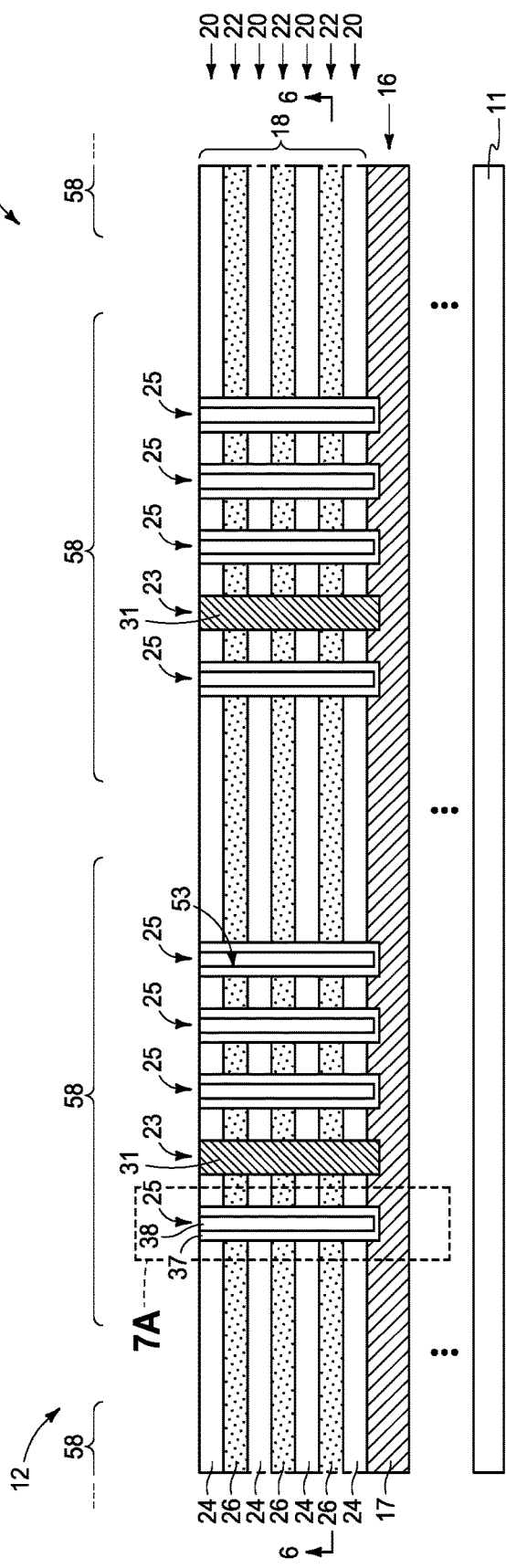

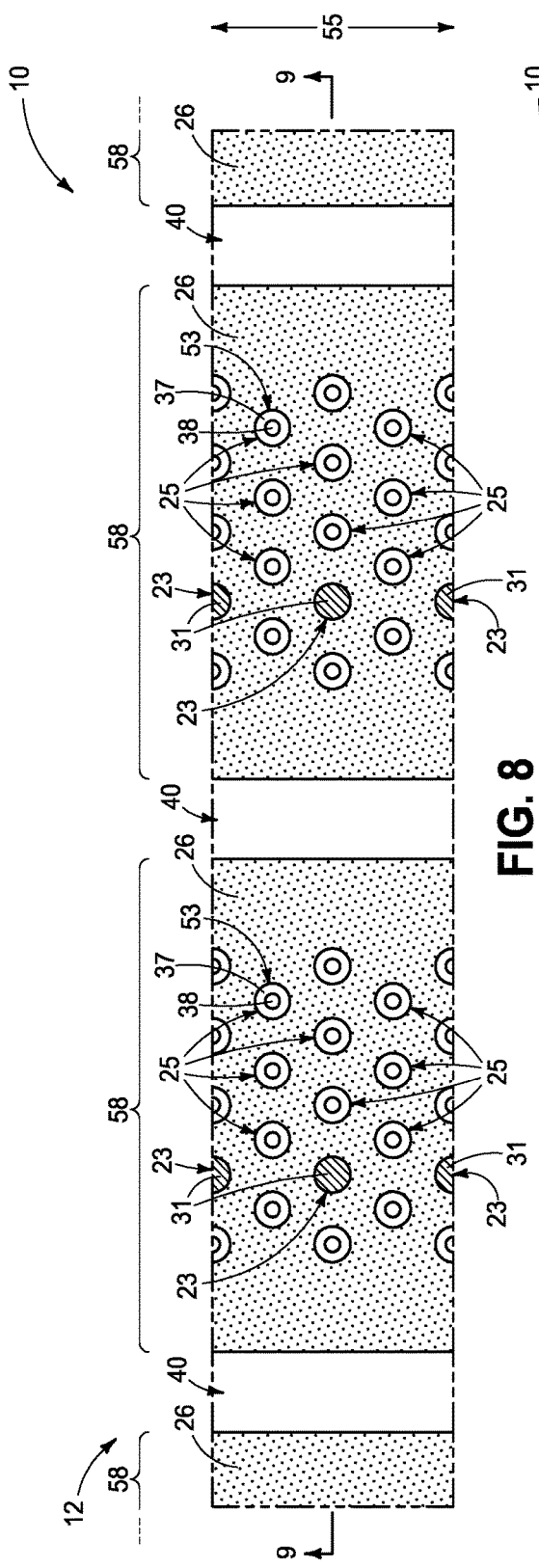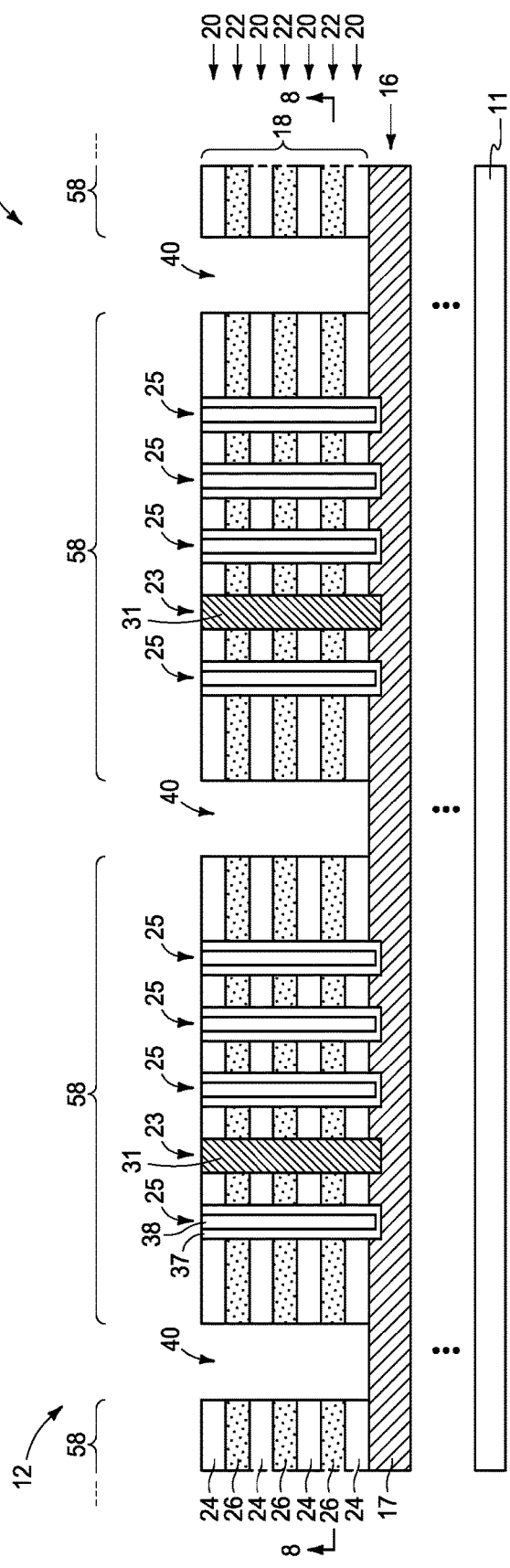

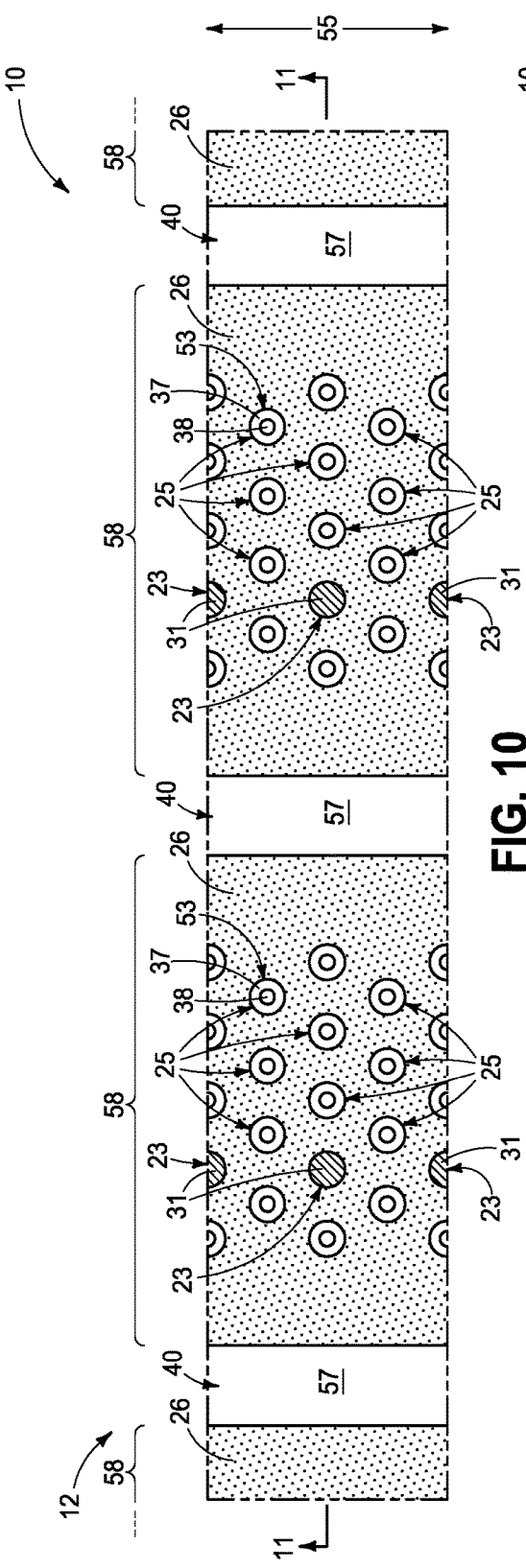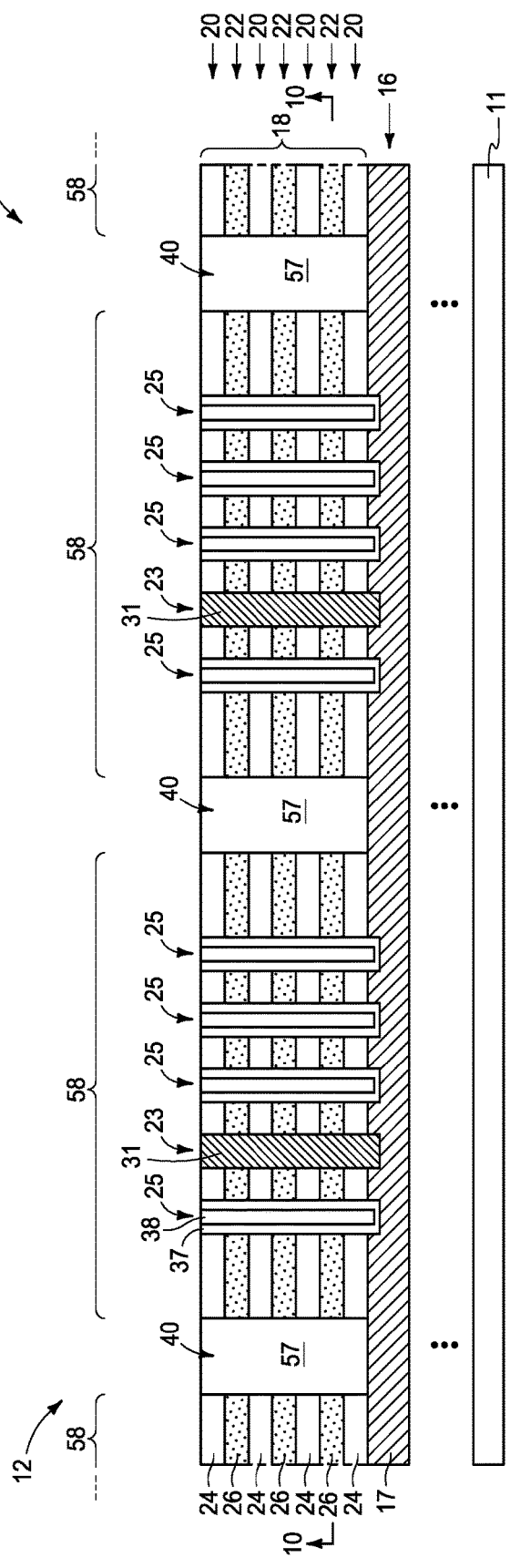

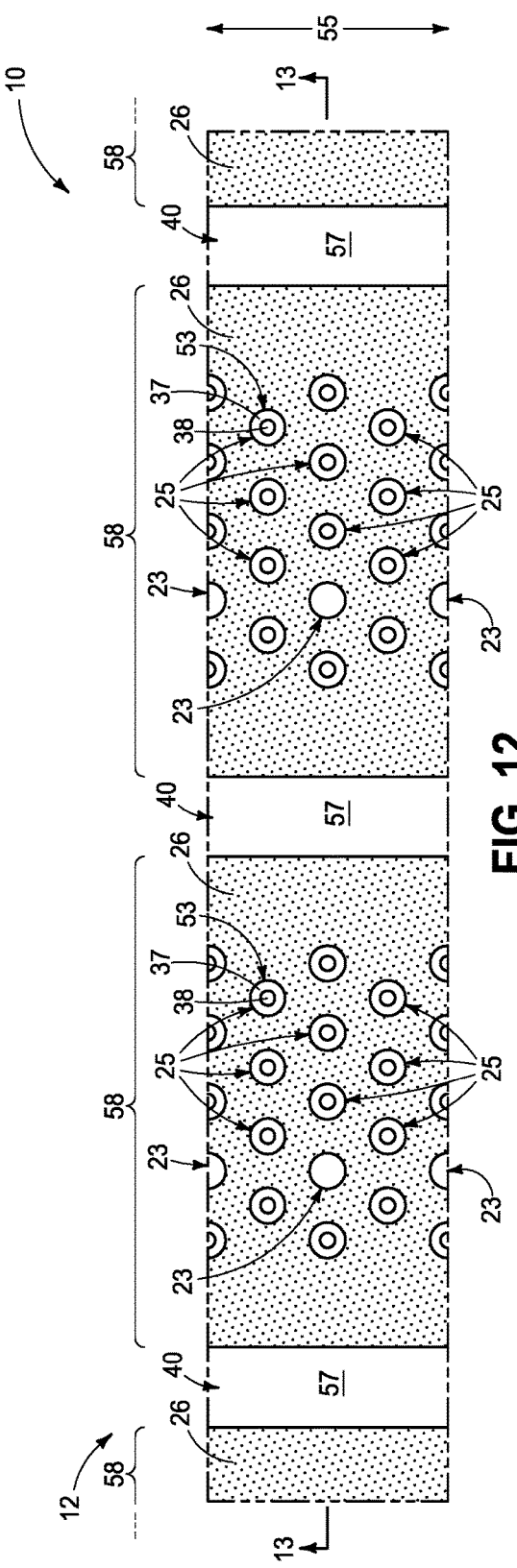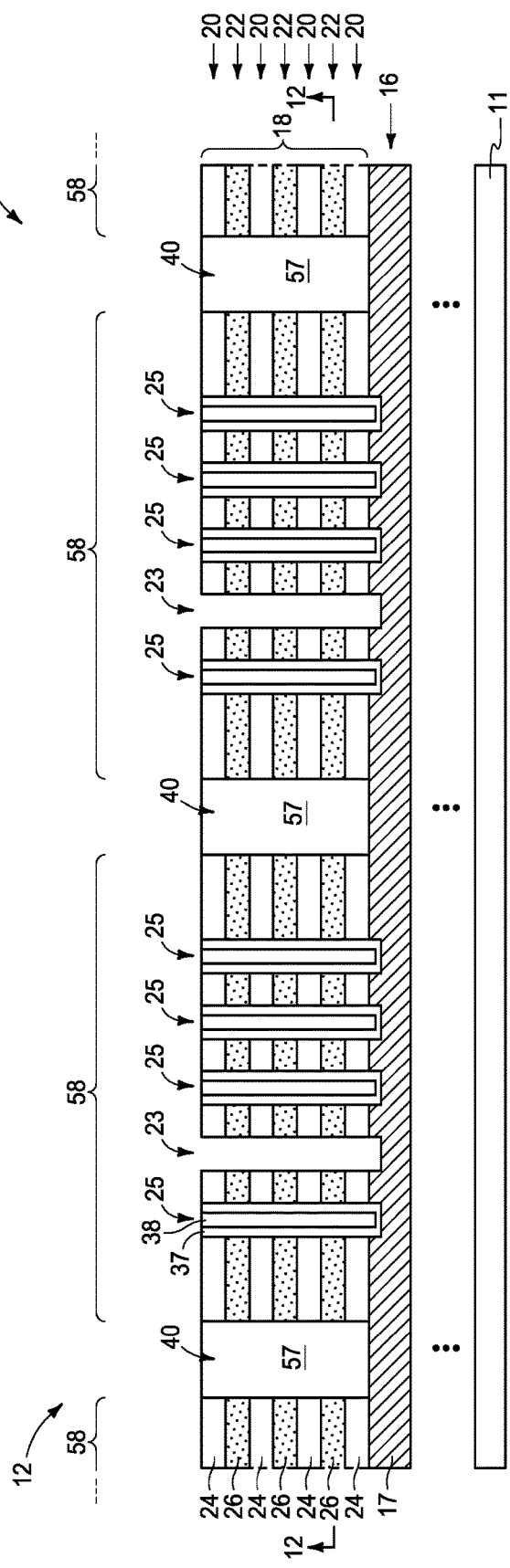

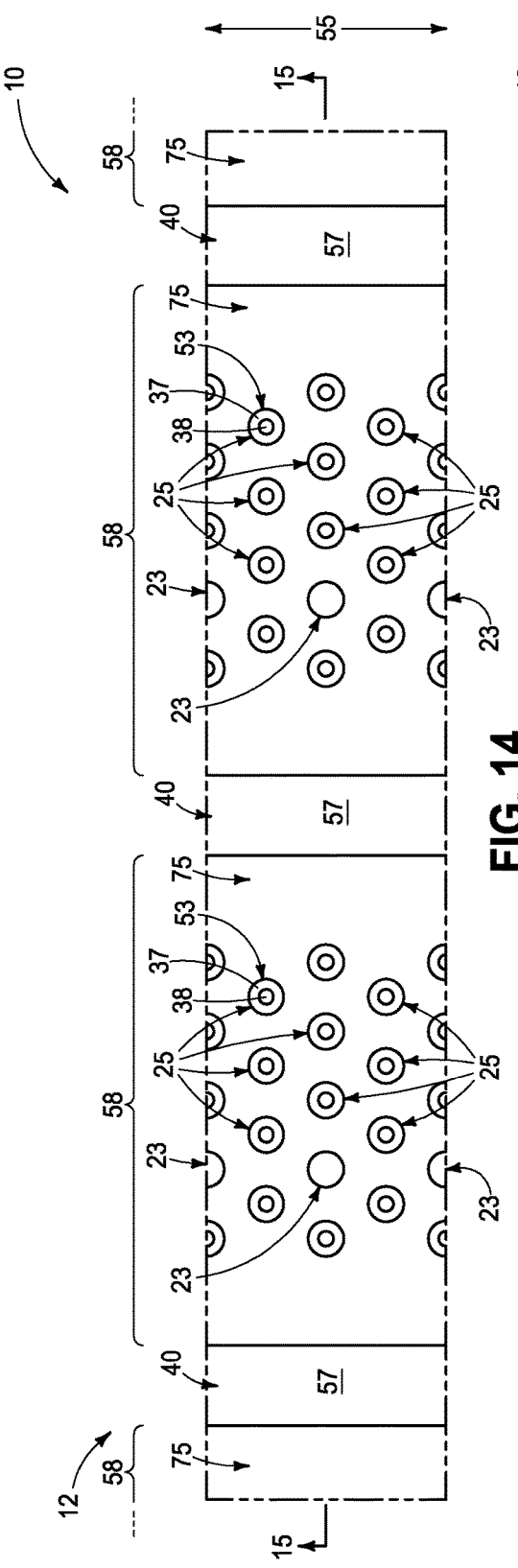
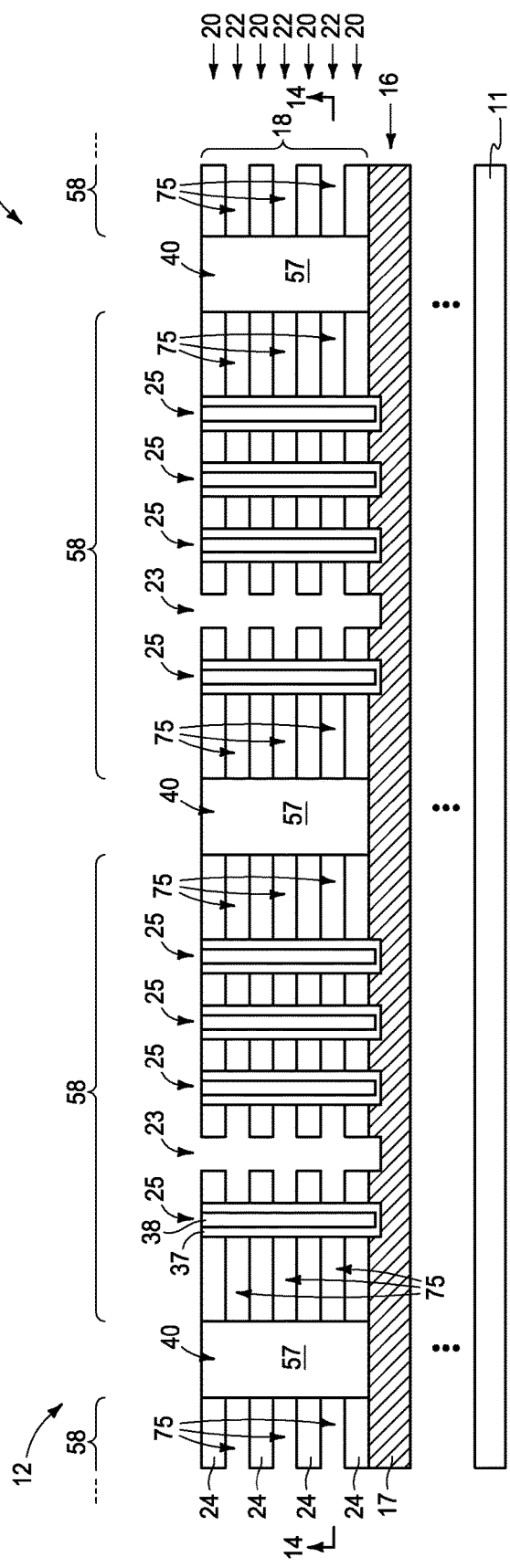
FIG. 14
FIG. 15

METHODS USED IN FORMING A MEMORY ARRAY COMPRISING STRINGS OF MEMORY CELLS

TECHNICAL FIELD

Embodiments disclosed herein pertain to memory arrays and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228659, 2016/0267984, and 2017/0140833, and which are hereby and herein fully incorporated by reference and aspects of which may be used in some embodiments of the inventions disclosed herein. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a diagrammatic cross-sectional view taken through line 2-2 in FIG. 1.

FIGS. 3-23 are diagrammatic sequential sectional and/or enlarged views of the construction of FIGS. 1 and 2, or portions thereof, in process in accordance with some embodiments of the invention.

DETAILED DESCRIPTION OF EXAMPLE EMBODIMENTS

Figure 3:
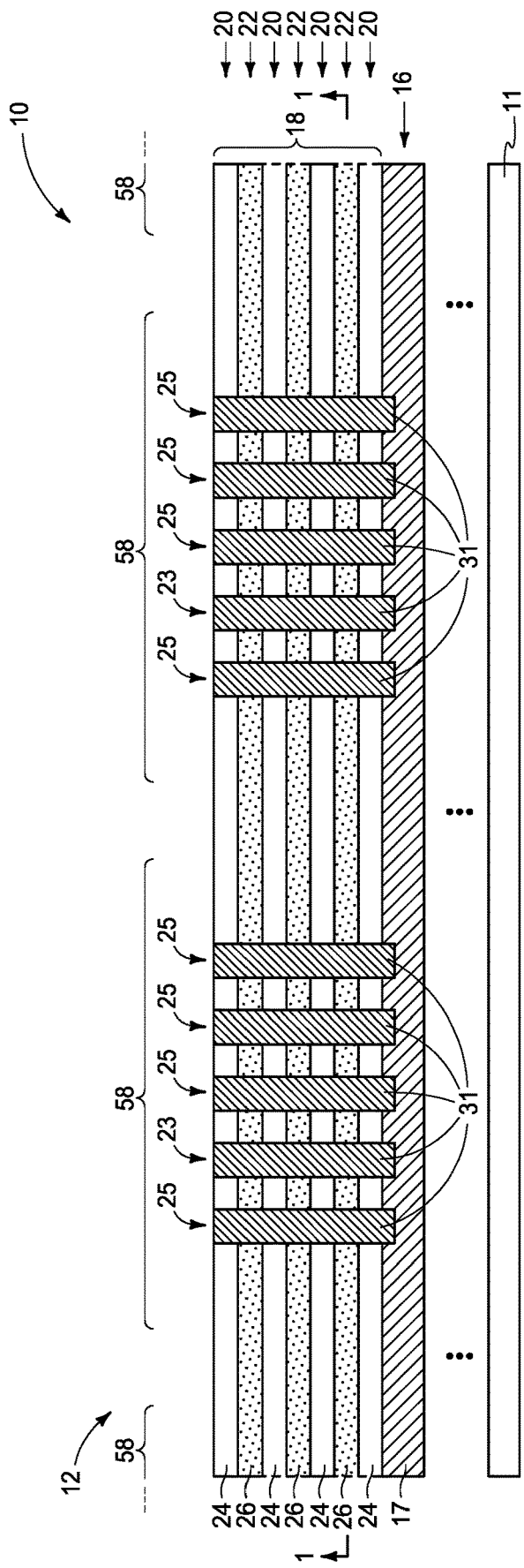
Figure 7A:
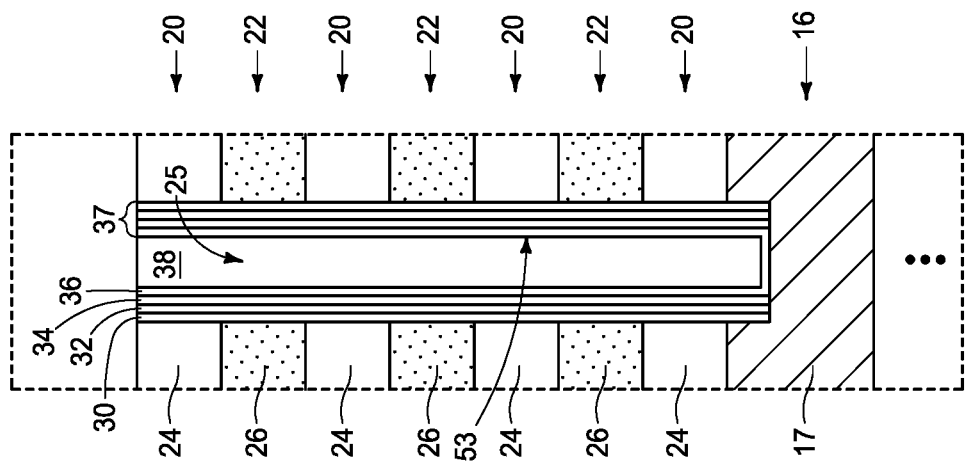
Figure 6A:
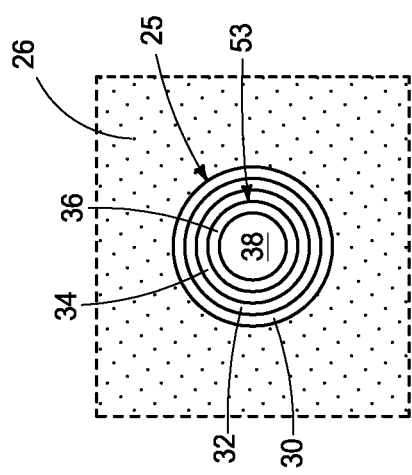

Some aspects of the invention were motivated in overcoming problems associated with so-called "block-bending" (a block stack tipping/tilting sideways relative to its longitudinal orientation during fabrication), although the invention is not so limited.

Embodiments of the invention encompass methods used in forming a memory array, for example an array of NAND or other memory cells having peripheral control circuitry under the array (e.g., CMOS-under-array). Embodiments of the invention also encompass a memory array (e.g., NAND architecture) independent of method of manufacture. First example method embodiments are described with reference to FIGS. 1-23.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductive material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. Example thickness for each of tiers 20 and 22 is 22 to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Regardless, conductive tiers 22 (alternately referred to as first tiers) may not comprise conducting material and insulative tiers 20 (alternately referred to as second tiers) may not comprise insulative material or be insulative at this point in processing. Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial. Uppermost insulative tier 20 may be considered as having a top surface 21.

Dummy-pillar openings 23 and operative channel openings 25 have been formed (e.g., by etching) through insulative tiers 20 and conductive tiers 22 to conductor tier 16. In this document, a "dummy-pillar opening" is an opening in which a "dummy pillar" has been or will be formed. A "dummy pillar" (further referenced below) is a circuit-inoperative pillar which in all operation of the circuitry has no current flow there-through and which may be a circuit inoperable dead end that is not part of a current flow path of a circuit even if extending to or from an electronic component. Openings 23 and 25 could be formed at the same time or at different times and/or with different masks, and not necessarily to the same depth(s). In some embodiments, openings 23 and 25 may go partially into conductive material 17 of conductor tier 16 as shown or may stop there-atop (not shown). Alternately, as an example, openings 23 and 25 may stop atop or within the lowest insulative tier 20. A reason for extending channel openings 25 at least to conductive material 17 of conductor tier 16 is to assure direct electrical coupling of subsequently-formed channel material (not yet shown) to conductor tier 16 without using alternative processing and structure to do so when such a connection is desired. Etch-stop material (not shown) may be within or atop conductive material 17 of conductor tier 16 to facilitate stopping of the etching of openings 23 and 25 relative to conductor tier 16 when such is desired. Such etch-stop material may be sacrificial or non-sacrificial. By way of example and for brevity only, openings 23 and 25 are shown as being arranged in groups or columns of staggered rows of four and five collective openings 23 and 25 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may otherwise not be discernable at this point of processing. Dummy-pillar openings 23 are shown arranged in a single column along direction 55. Alternately, openings 23 may not be so arranged and may be arranged sporadically and/or be fewer or greater in number relative to the number of openings 25. Any alternate existing or future-developed arrangement and construction may be used.

Referring to FIG. 3, and in one embodiment, sacrificial material 31 has been formed to fill channel openings 25 and dummy-pillar openings 23. Any suitable material 31 may be used, and ideally one(s) which is/are selectively etchable relative to materials 24 and 26, with doped or undoped polysilicon being but two examples. Material 31 may be deposited to overfill openings 23 and 25 and then polished back at least to the top surface of stack 18.

Referring to FIGS. 4 and 5, sacrificial material 31 has been removed from channel openings 25 while remaining in dummy-pillar openings 23. Such may be conducted, for example, by masking (not shown) dummy-pillar openings 23 while isotropically etching sacrificial material 31 selectively relative to materials 24 and 26.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 6, 6A, 7, and 7A show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory cell materials) may be formed by, for example, deposition of respective thin layers thereof over stack 18 and within individual channel openings 25 followed by planarizing such back at least to a top surface of stack 18. Channel material 36 has also been formed in channel openings 25 elevationally along insulative tiers 20 and conductive tiers 22, thus comprising individual operative channel-material strings 53. Materials 30, 32, 34, and 36 are collectively shown as and only designated as material 37 in FIGS. 3 and 4 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductive material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductive material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Conductive plugs (not shown) may be formed atop channel material strings 53 for better conductive connection to overlying circuitry (not shown).

Referring to FIGS. 8 and 9, horizontally-elongated trenches 40 have been formed (e.g., by anisotropic etching) into stack 18 to form laterally-spaced memory-block regions 58. Horizontally-elongated trenches 40 may have respective bottoms that are directly against conductive material 17 (e.g., atop or within) of conductor tier 16 (as shown) or may have respective bottoms that are above conductive material 17 of conductor tier 16 (not shown).

The above processing shows forming and filling channel openings 25 prior to forming trenches 40. Such could be reversed. Alternately, trenches 40 could be formed in between the forming and filling of channel openings 25 (not ideal).

Referring to FIGS. 10 and 11, intervening material 57 has been formed in horizontally-elongated trenches 40. Intervening material 57 may provide lateral electrical isolation (insulation) between immediately-laterally-adjacent memory-block regions 58 and ultimate memory blocks 58. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. In one embodiment, intervening material 57 comprises a laterally-outermost insulative material (e.g., silicon dioxide and not shown) and a laterally-inner material (e.g., undoped polysilicon and not shown) of different composition from that of the laterally-outermost insulative material. In one such embodiment, the laterally-inner material is insulative. In one embodiment, intervening material 57 is everywhere insulative between the immediately-laterally-adjacent memory blocks.

Referring to FIGS. 12 and 13, sacrificial material 31 (not shown) has been removed from dummy-pillar openings 23. By way of examples, a mask (not shown) could be formed atop stack 18 having openings therein over dummy-pillar openings 23, and using such mask while isotropically etching sacrificial material 31 from openings 23. Alternately, as an example, no mask may be used and sacrificial material 31 etched selectively relative to materials 24, 26, 37, 38, and 57.

Referring to FIGS. 14 and 15, material 26 (not shown) of conductive tiers 22 has been isotropically etched away through dummy-pillar openings 23 ideally selectively relative to the other exposed materials (e.g., using liquid or vapor $H_3PO_4$ as a primary etchant where material 26 is silicon nitride, and other materials comprise one or more oxides or polysilicon). Void space 75 is formed thereby.

Figure 16:
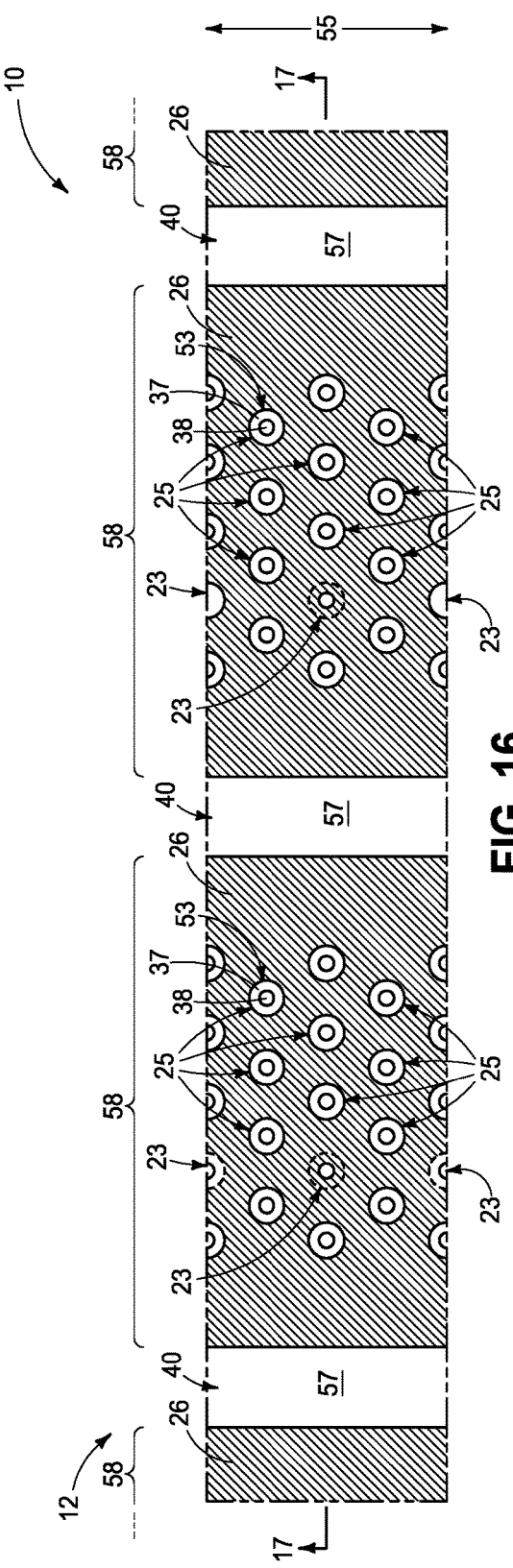
Figure 17:
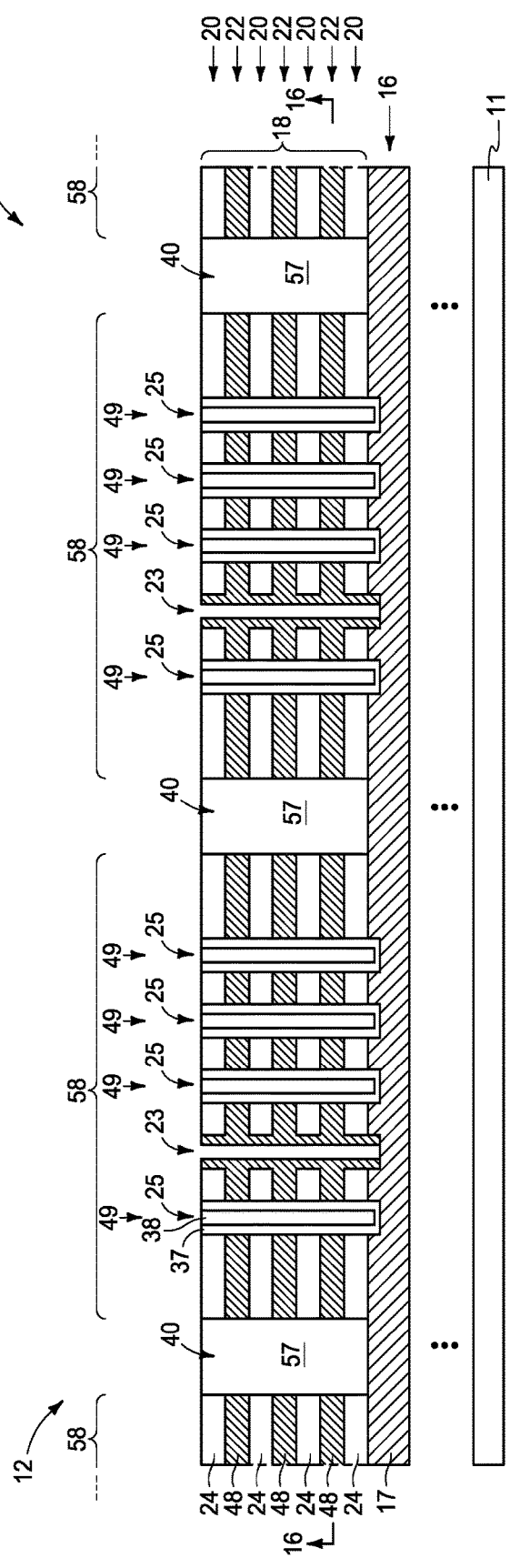
Figure 18:
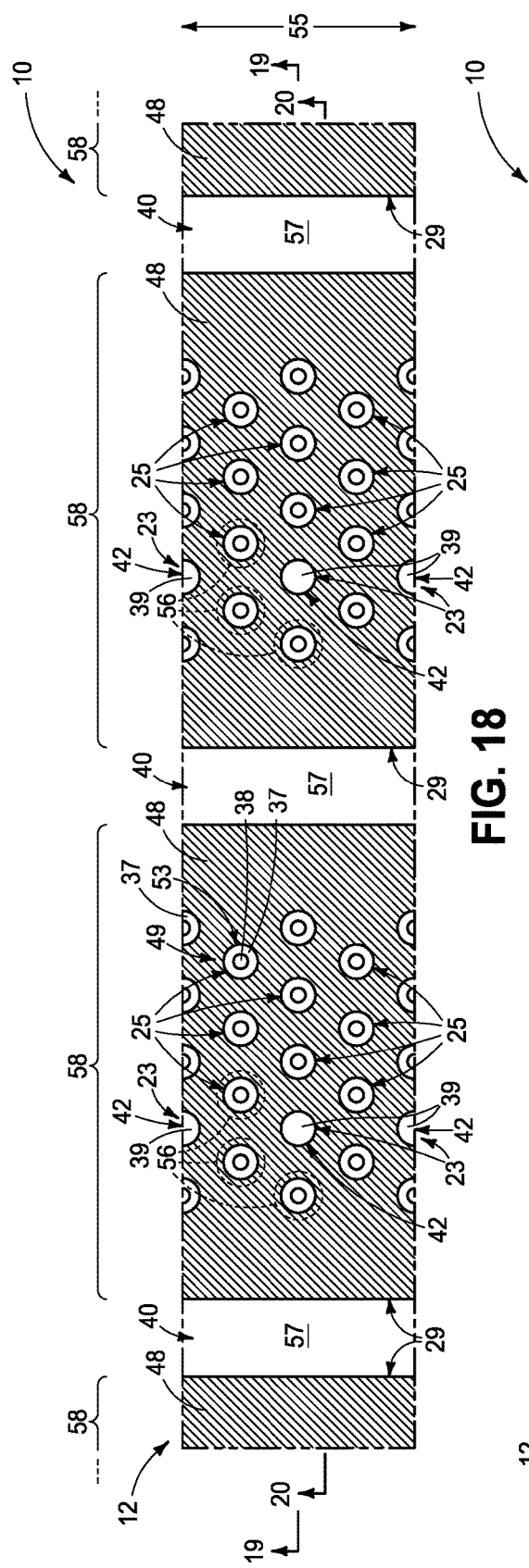
Figure 19:
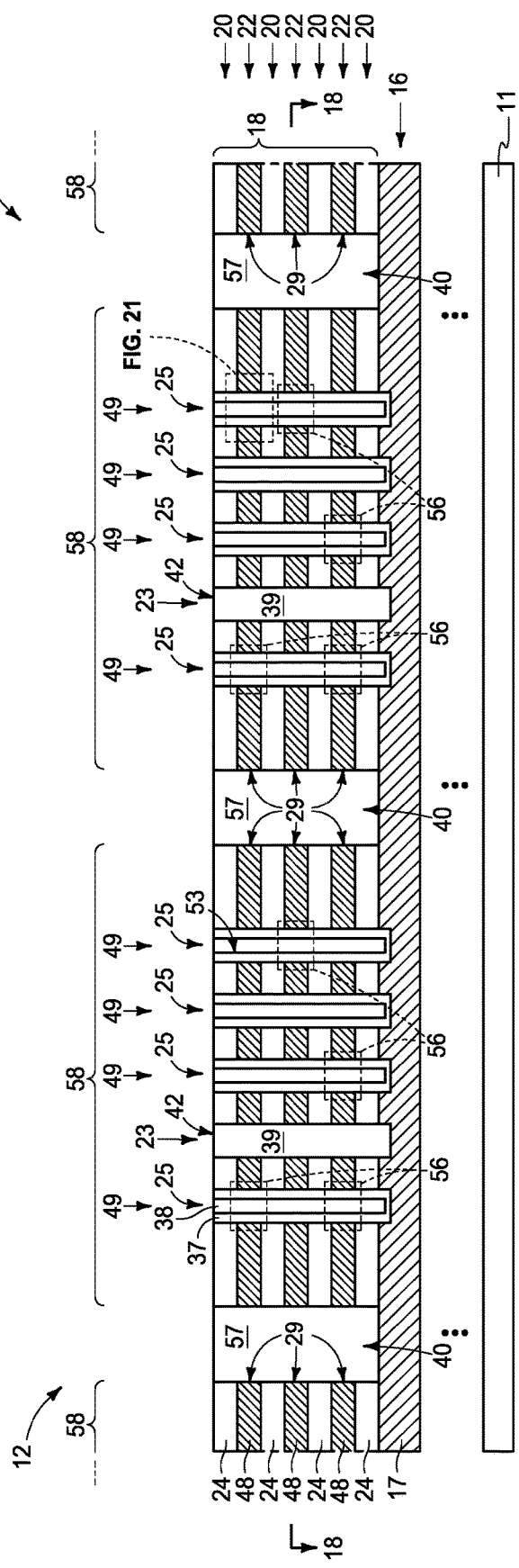
Figure 20:
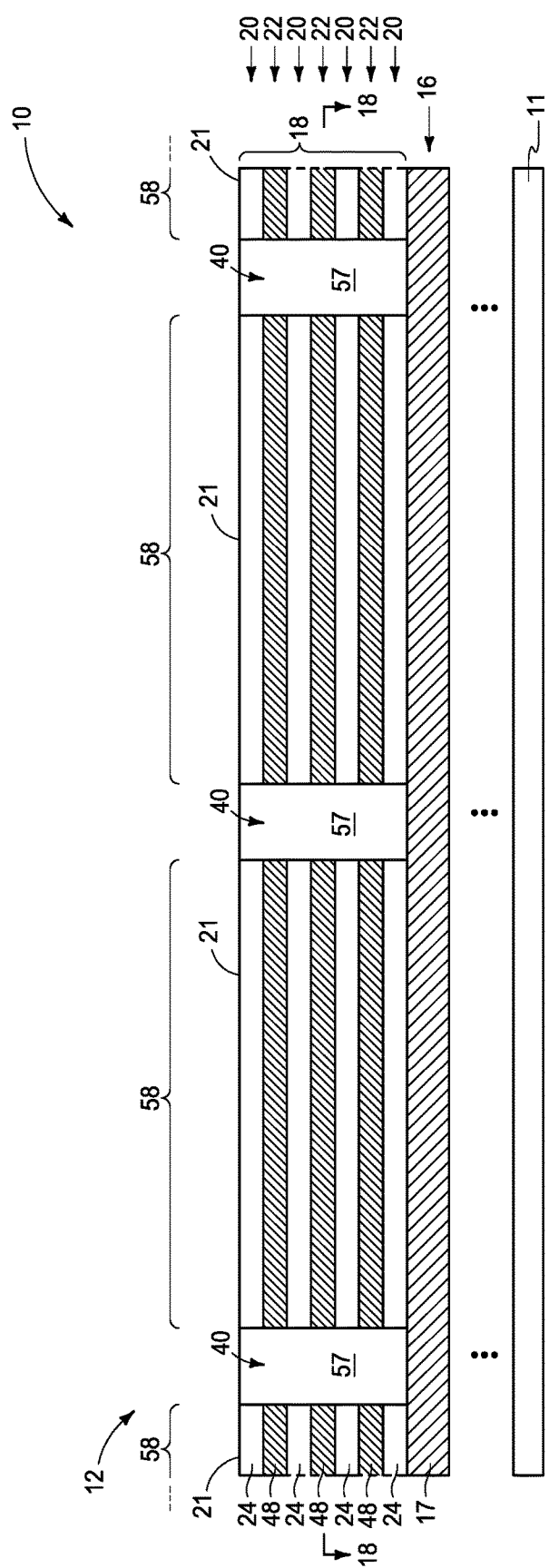
Figure 21:
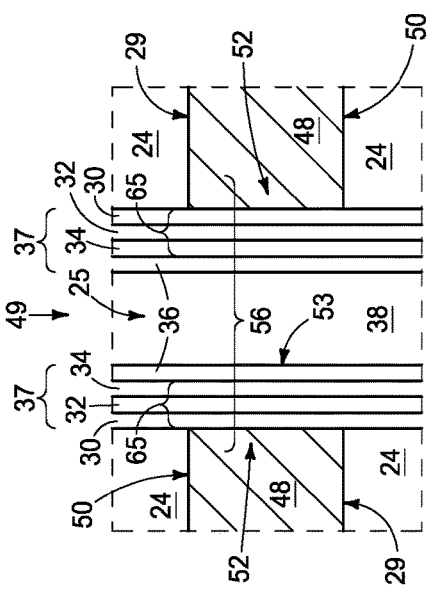

Referring to FIGS. 16 and 17, material 26 (not shown) in conductive tiers 22 in the example embodiment is sacrificial and has been replaced with conducting material 48. In one embodiment and as shown, at the conclusion forming conducting material 48, such extends elevationally along insulative tiers 20 in individual dummy-pillar openings 23.

Referring to FIGS. 18-21, conducting material 48 has been removed (e.g., by a timed isotropic etching) from dummy-pillar openings 23 and fill material 39 has been formed therein to form a dummy pillar 42 in individual dummy-pillar openings 23. In some embodiments, dummy pillars 42 are referred to as first dummy pillars 42. At least the radial-periphery of fill material 39 of dummy pillar 42 between conductive tiers 22 should be insulative (e.g., silicon dioxide and/or silicon nitride) to preclude shorting of different-elevation conductive tiers 22 within individual memory blocks 58. In one embodiment, all fill material 39 of dummy pillars 42 is insulative. In another embodiment, at least all of the radial-periphery of fill material 39 all along dummy pillar is insulative.

FIGS. 16-21 show example forming of individual conductive lines 29 (e.g., wordlines) comprising conducting material 48 and elevationally-extending strings 49 of individual transistors and/or memory cells 56. A thin insulative liner (e.g., $Al_2O_3$ and not shown) may be formed before forming conducting material 48. Approximate locations of transistors and/or memory cells 56 are indicated with a bracket in FIG. 21 and some with dashed outlines in FIGS. 18 and 19, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 21) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Previously in "replacement gate processing", material 26 would be isotropically etched and replaced through trenches 40. Such required trenches 40 to be sufficiently wide to assure such could occur. Such trenches may be narrowed when the acts of etching and replacing occur through dummy-pillar openings 23, meaning wider memory blocks 58 and more conducting material 48 in conductive lines 29.

Any other attribute(s) or aspect(s) as shown and/or described herein with respect to other embodiments may be used with respect to the above-described embodiments.

An embodiment of the invention comprises a method used in forming a memory array (e.g., 12) comprising strings (e.g., 49) of memory cells (e.g., 56). Such a method comprises forming a stack (e.g., 18) comprising vertically-alternating insulative tiers (e.g., 20) and conductive tiers (e.g., 22). The conductive tiers individually comprise void space (e.g., 75). The stack comprises individual longitudinally-aligned dummy-pillar openings (e.g., 23) extending through the insulative tiers. Conducting material (e.g., 48) is formed in the void space of the conductive tiers by flowing the conducting material or one or more precursors thereof through the dummy-pillar openings to into the void space of the conductive tiers. The conducting material extends elevationally along the insulative tiers and individual of the dummy-pillar openings. After forming the conducting material, it is removed from being elevationally along the insulative tiers in the individual dummy-pillar openings. Thereafter, a dummy pillar (e.g., 42) is formed in individual of the dummy-pillar openings. Operative channel-material strings (e.g., 53) of memory cells (e.g., 56) are formed to extend through the insulative tiers and the conductive tiers.

In one embodiment, the operative channel-material strings are formed before forming the dummy pillars. In one such embodiment, the operative channel-material strings are formed before removing the conducting material from being elevationally along the insulative tiers in the individual dummy-pillar openings. In once such embodiment, the operative channel-material strings are formed before forming the conducting material.

In one embodiment, channel openings (e.g., 25) are formed through the insulative tiers and the conductive tiers in which the operative channel-material strings are formed, with the channel openings and the dummy-pillar openings being formed at the same time. In one such embodiment, the method comprises filling and removing sacrificial material (e.g., 31) from the channel openings and the dummy-pillar openings. In one such embodiment, the filling of the channel openings and the dummy-pillar openings with the sacrificial material occur at the same time and the removing of the sacrificial material from the channel openings and the dummy-pillar openings occur at different times. In one such embodiment, the removing of the sacrificial material from the channel openings occurs before the removing of the sacrificial material from the dummy-pillar openings. In one such embodiment, channel material of the operative channel-material strings is formed in the channel openings before the removing of the sacrificial material from the dummy-pillar openings.

In one embodiment, such a method comprises forming and filling horizontally-elongated trenches (e.g., 40) in the stack with intervening material (e.g., 57) to form laterally-spaced memory-block region (e.g., 58), with the filling of such with the intervening material occurring before forming the conducting material. In one such embodiment, the filling with the intervening material occurs before forming the void space in individual of the conductive tiers.

Any other attribute(s) or aspect(s) as shown and/or described herein with respect to other embodiments may be used.

Figure 22:
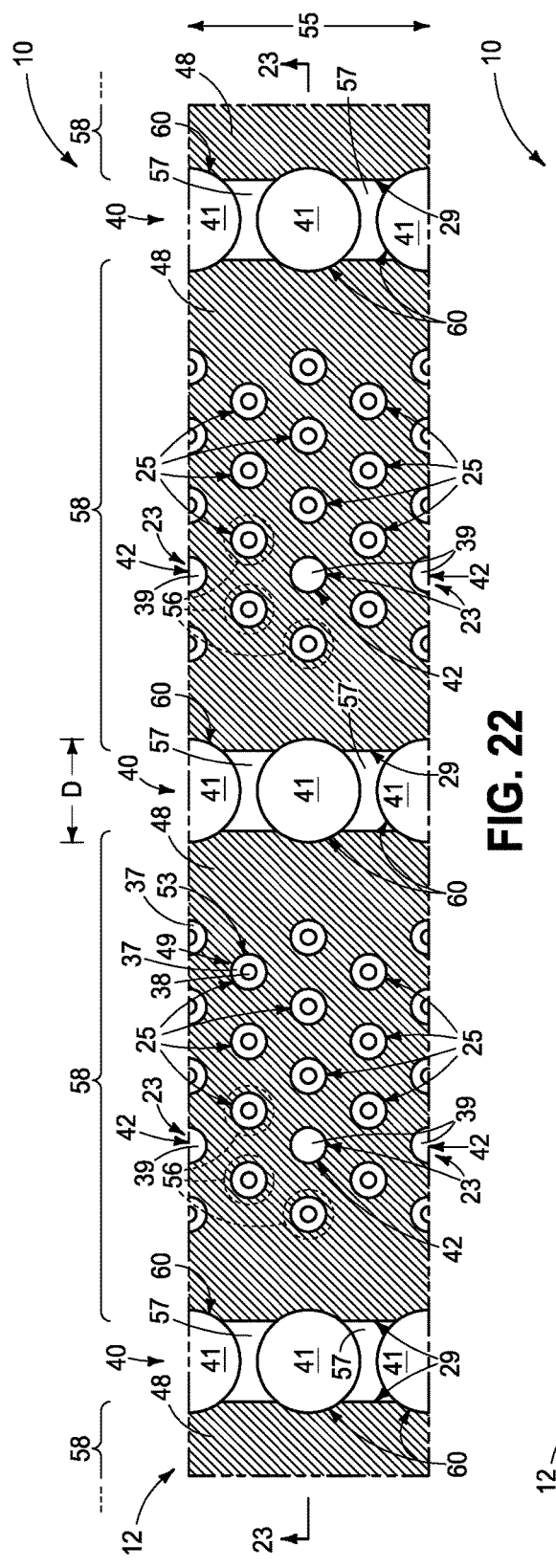
Figure 23:
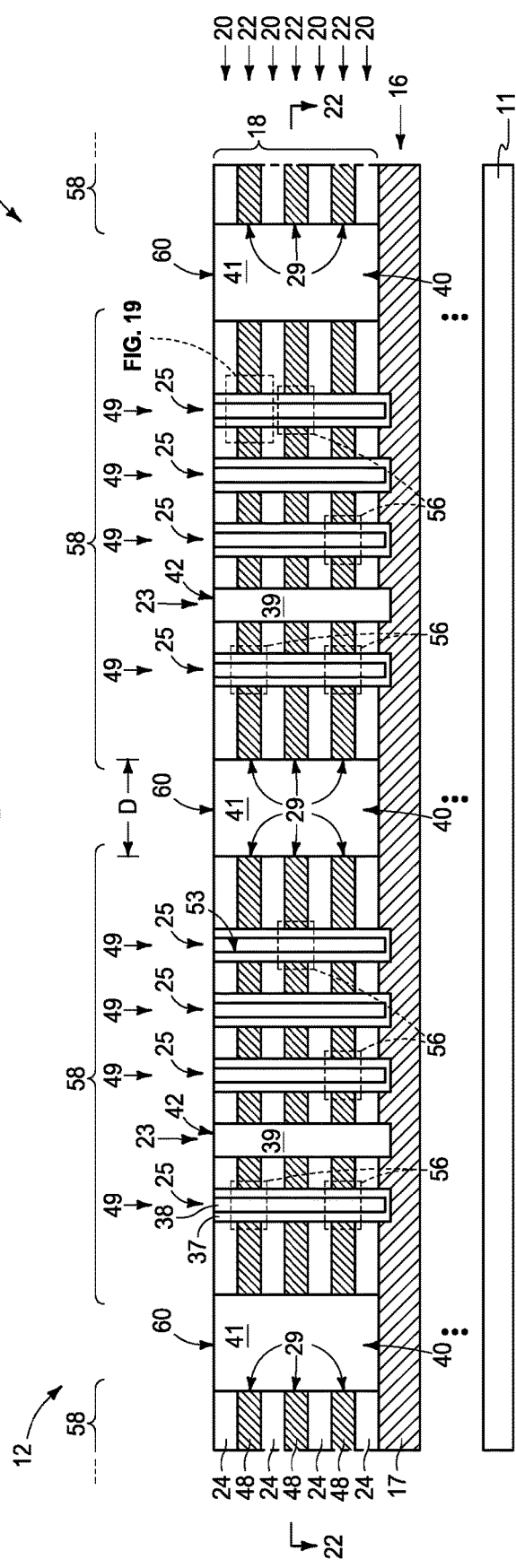

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments. As an example, FIGS. 22 and 23 show additional processing that may have occurred at any time relative to the processing described above with respect to FIGS. 1-21. In such example, second dummy pillars 60 comprising material 41 have been formed between immediately-adjacent memory blocks 58. In some embodiments, second dummy pillars 60 are referred to as additional dummy pillars. Materials 41 and 39 may be the same or different relative one another. Regardless, material 41 and second dummy pillars 60 may have the same compositional attributes as material 39 and dummy pillars 42, respectively.

An embodiment of the invention includes a memory array (e.g., 12) comprising strings (e.g., 49) of memory cells (e.g., 56). Such a memory array comprises laterally-spaced memory blocks (e.g., 58) individually comprising a vertical stack (e.g., 18) comprising alternating insulative tiers (e.g., 20) and conductive tiers (e.g., 22). Operative channel-material strings (e.g., 53) of the memory cells extend through the insulative tiers and the conductive tiers. First dummy pillars (e.g., 42) are in the memory blocks and extend through at least a majority of the insulative tiers and the conductive tiers through which the channel-material strings extend. Referring to FIGS. 22 and 23, second dummy pillars (e.g., 60) are laterally-between and longitudinally-spaced-along immediately-laterally-adjacent memory blocks 58. The second dummy pillars extend through at least a majority of the insulative tiers and the conductive tiers through which the operative channel-material strings extend laterally-between the immediately-laterally-adjacent memory blocks. The first dummy pillars and the second dummy pillars may be of the same composition or of different compositions relative one another.

In some embodiments, the first and/or second dummy pillars extend through at least all of the insulative tiers and all of the conductive tiers through which the operative channel-material strings extend. In one embodiment, the first and second dummy pillars extend through the same insulative and conductive tiers. In one embodiment, the first and second dummy pillars have the same height, and in one embodiment with the operative channel-material strings having common height relative one another and that is such same height as the first and second dummy pillars.

In one embodiment, the first and second dummy pillars individually comprise peripherally-surrounding insulative material elevationally there-along. For example, as a minimum, the radially outer most portions of the first and second dummy pillars may be insulative regardless of material radially there-within. Yet, in one embodiment, the first and second dummy pillars individually at least predominately (i.e., more than 50% by volume) comprise insulative material, in one such embodiment consists essentially of insulative material, and in one such embodiment consist of insulative material.

In one embodiment, the first and second dummy pillars extend vertically or within 10° of vertical. In one embodiment, the immediately-adjacent memory blocks have a maximum lateral-separation distance (e.g., D in FIGS. 22 and 23) of 120 to 220 nanometers (in one embodiment no more than 150 nanometers) in an uppermost of the insulative tiers. In one embodiment, the first dummy pillars individually have a minimum horizontal width of 50 to 100 nanometers in an uppermost of the insulative tiers.

Any other attribute(s) or aspect(s) as shown and/or described herein with respect to other embodiments may be used.

Embodiments of the invention include a memory array (e.g., 12) comprising strings (e.g., 49) of memory cells (e.g., 56). Such a memory array comprises laterally-spaced memory blocks (e.g., 58) individually comprising a vertical stack (e.g., 18) comprising alternating insulative tiers (e.g., 20) and conductive tiers (e.g., 22). Operative channel-material strings (e.g., 53) of the memory cells extend through the insulative tiers and the conductive tiers. Immediately-adjacent of the memory blocks have a maximum lateral-separation distance (e.g., D) of 120 to 220 nanometers in an uppermost of the insulative tiers. Dummy pillars (e.g., 42) are in the memory blocks and extend through at least a majority of the insulative tiers and the conductive tiers through which the operative channel-material strings extend. The dummy pillars individually have a minimum horizontal width of 50 to 100 nanometers in the upper most insulative tier. Any other attribute(s) or aspect(s) as shown and/or described herein with respect to other embodiments may be used.

In one such embodiment, dummy pillars (e.g., 60) are laterally-between and longitudinally-spaced-along immediately-laterally-adjacent memory blocks. Such dummy pillars extend through at least a majority of the insulative tiers and the conductive tiers through which the operative channel-material strings extend.

Figure 24:
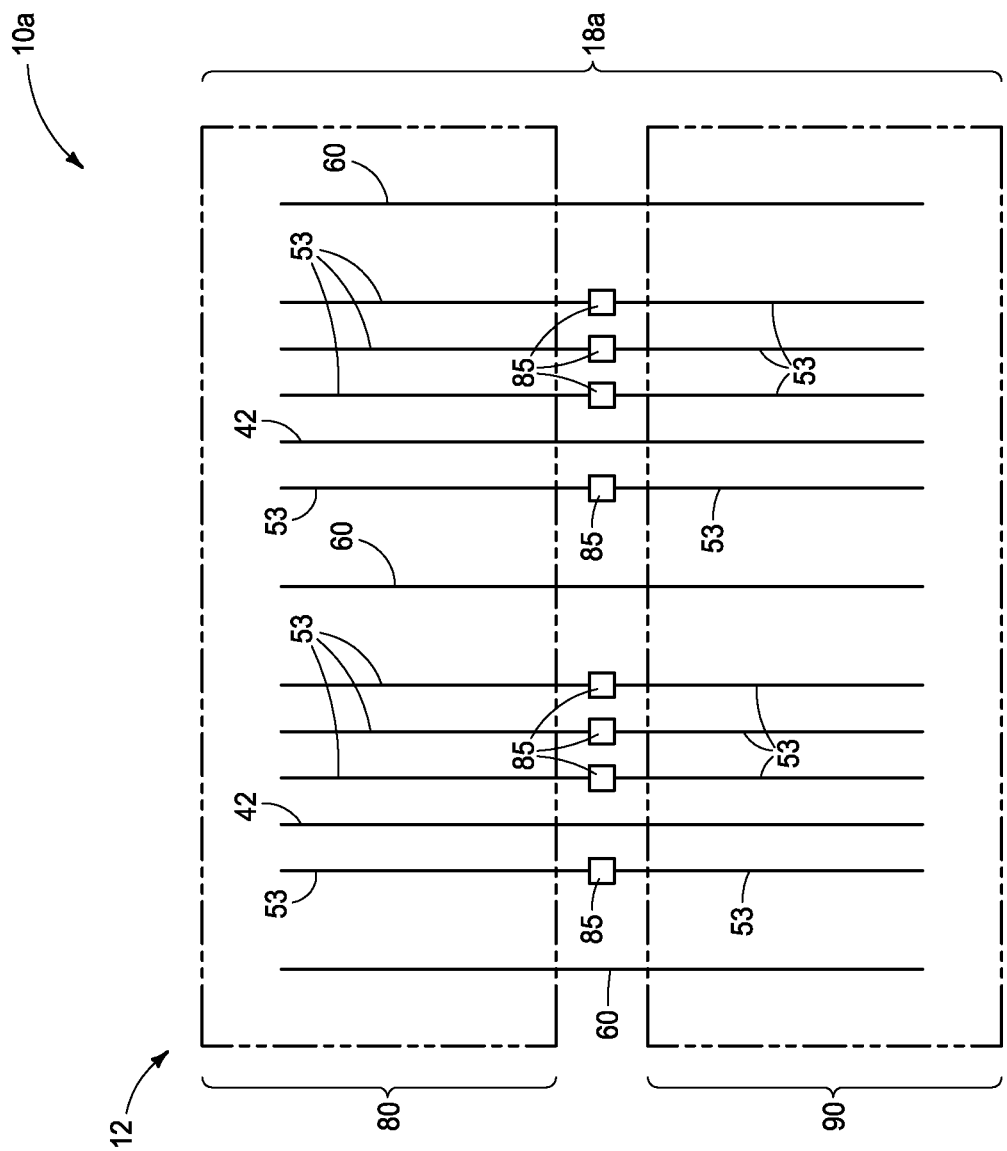
FIG. 24 is a diagrammatic view of a construction in accordance with an embodiment of the invention.

The above-described example embodiment shows vertical stack 18 as comprising a single continuous stack and processing relative thereto. Alternately, such processing and resultant construction may be conducted, result, or independent of method comprise an alternate construction 10a as diagrammatically shown in FIG. 24. Like numerals from the above-described embodiments have been used where appropriate, with some construction differences being indicated with the suffix "a" or with different numerals. FIG. 24 diagrammatically shows vertical stack 18a as comprising a lower stack 90 and an upper stack 80 directly above lower stack 90. Lower stack 90 comprises vertically-alternating lower insulative tiers and lower conductive tiers and lower-laterally-spaced memory blocks. The tiers and blocks are not shown or numerically designated in FIG. 24 for clarity and could have any of the attributes described above with respect to stack 18. Analogously, upper stack 80 comprises vertically-alternating upper insulative tiers and upper conductive tiers above lower stack 90 and comprises upper-laterally-spaced memory blocks that are directly above the lower-laterally-spaced memory blocks and could have any of the attributes described above with respect to stack 18.

Operative channel-material strings 53 of the memory cells extend through the upper insulative tiers, the upper conductive tiers, the lower insulative tiers, and the lower conductive tiers. Such operative channel-material strings may be formed commonly through the upper and lower stack tiers or, for example, separately in the lower stack before forming the upper stack. Such operative channel-material strings may extend continuously from and between upper stack 80 and lower stack 90. Alternately, by way of example only, such channel-material strings may comprise a conductive interconnect (not shown) between upper stack 80 and lower stack 90. Dummy pillars 42 (e.g., first dummy pillars 42) extend through at least a majority of the upper insulative tiers, the upper conductive tiers, the lower insulative tiers, and the lower conductive tiers through which the operative channel-material strings extend. Such are diagrammatically shown and numerically designated as abbreviated vertical lines in FIG. 24. In one embodiment, additional dummy pillars 60 (e.g., second dummy pillars 60) are laterally-between and longitudinally-spaced-along immediately-laterally-adjacent of the upper and lower memory blocks. The additional dummy pillars extend through at least a majority of the upper insulative tiers, the upper conductive tiers, the lower insulative tiers, and the lower conductive tiers through which the operative channel-material strings extend. The dummy pillars 42 and/or 60 may be formed commonly through the upper and lower stack tiers or, for example, separately in the lower stack before forming the upper stack. In one embodiment, the upper and lower stacks are immediately-vertically-adjacent one another (i.e. there being no additional analogous stack between the upper and lower stacks). Any other attribute(s) or aspect(s) as shown and/or described herein with respect to other embodiments may be used.

In some embodiments, and primarily with reference to FIG. 24, the forming of the stack comprises forming a lower stack (e.g., 90) comprising the alternating tiers. A first portion of individual of the dummy-pillar openings is formed in the lower stack. Such first portion is filled with a sacrificial material (e.g., 31). An upper stack (e.g., 90) is formed directly above the lower stack. A second portion of individual of the dummy-pillar openings is formed in the upper stack. The second portion is filled with the sacrificial material. The sacrificial material is etched from the both the first and second portions. The void space (e.g., 75) is formed in the first tiers in the upper and lower stacks. Any other attribute(s) or aspect(s) as shown and/or described herein with respect to other embodiments may be used.

In one such embodiment, the operative channel-material strings are formed after the upper stack is formed directly above the lower stack.

In another one such embodiment, forming the operative channel-material strings comprises forming a first portion of each of the operative channel-material strings in the lower stack before forming the upper stack directly above the lower stack, and forming a second portion of each of the operative channel-material strings in the upper stack after forming the upper stack directly above the lower stack. One such another embodiment comprises forming conductive plugs (e.g., 85) directly electrically coupled to the first portions of the operative channel-material strings before forming the upper stack directly above the lower stack, with each of the second portions of the operative channel-material strings being directly electrically coupled to a respective one of the first portions through a respective one of the conductive plugs.

Any other attribute(s) or aspect(s) as shown and/or described herein with respect to other embodiments may be used with respect to the one such embodiment and the another one such embodiment.

The above processing(s) or construction(s) may be considered as being relative to an array of components formed as or within a single stack or single deck or as or within two stacks or two decks of such components above or as part of an underlying base substrate (albeit, the individual stacks/decks may each have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. First dummy pillars in the memory blocks extend through at least a majority of the insulative tiers and the conductive tiers through which the channel-material strings extend. Second dummy pillars are laterally-between and longitudinally-spaced-along immediately-laterally-adjacent of the memory blocks. The second dummy pillars extend through at least a majority of the insulative tiers and the conductive tiers through which the operative channel-material strings extend laterally-between the immediately-laterally-adjacent memory blocks.

In some embodiments, a memory array comprising strings of memory cells comprises laterally-spaced memory blocks individually comprising a vertical stack comprising alternating insulative tiers and conductive tiers. Operative channel-material strings of memory cells extend through the insulative tiers and the conductive tiers. Immediately-adjacent of the memory blocks have a maximum lateral-separation distance of 120 to 220 nanometers in an uppermost of the insulative tiers. Dummy pillars in the memory blocks extend through at least a majority of the insulative tiers and the conductive tiers through which the operative channel-material strings extend. The dummy pillars individually have a minimum horizontal width of 50 to 100 nanometers in the uppermost insulative tier.

In some embodiments, a method used in forming a memory array comprising strings of memory cells comprises forming a stack comprising vertically-alternating first tiers and second tiers. The first tiers individually comprise void space. Individual longitudinally-aligned dummy-pillar openings extend through the second tiers. Conducting material is formed in the void space of the first tiers by flowing conducting material or one or more precursors thereof through the dummy-pillar openings to into the void space of the first tiers. The conducting material extends elevationally along the second tiers in individual of the dummy-pillar openings. After the forming of the conducting material, the conducting material is removed from being elevationally along the second tiers in the individual dummy-pillar openings. After the removing, a dummy pillar is formed in individual of the dummy-pillar openings. Operative channel-material strings of memory cells are formed and extend through the second tiers and the first tiers.

In some embodiments, a method used in forming a memory array comprising strings of memory cells comprises forming a stack comprising vertically-alternating first tiers and second tiers. The first tiers comprise sacrificial material. Dummy-pillar openings and channel openings are formed through the second tiers, the first tiers, and the sacrificial material. Horizontally-elongated trenches are formed and filled in the stack with intervening material to form laterally-spaced memory-block regions. Through the dummy-pillar openings, the sacrificial material that is in the first tiers is isotropically etched away and replaced with conducting material of individual conductive lines in the memory-block regions. The etching and replacing occur after the filling of the trenches with the intervening material. After the replacing, a dummy pillar is formed in individual of the dummy-pillar openings. An operative channel-material string of memory cells is formed and extends through the second tiers and the first tiers in individual of the channel openings.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
forming a vertical stack comprising vertically-alternating first tiers and second tiers, the first tiers individually comprising void space, individual longitudinally-aligned dummy-pillar openings extending through the second tiers;
forming conducting material in the void space of the first tiers by flowing the conducting material or one or more precursors thereof through the dummy-pillar openings into the void space of the first tiers, the conducting material extending elevationally along the second tiers in individual of the dummy-pillar openings;
after the forming of the conducting material, removing the conducting material from being elevationally along the second tiers in the individual dummy-pillar openings;
after the removing, forming a dummy pillar in the individual dummy-pillar openings; and forming operative channel-material strings of memory cells extending through the second tiers and the first tiers.

2. The method of claim 1 comprising forming the operative channel-material strings before forming the dummy pillars.

3. The method of claim 2 comprising forming the operative channel-material strings before the removing.

4. The method of claim 3 comprising forming the operative channel-material strings before forming the conducting material.

5. The method of claim 1 comprising forming channel openings through the second tiers and the first tiers in which the operative channel-material strings are formed, the channel openings and the dummy-pillar openings being formed at the same time.

6. The method of claim 5 comprising filling the channel openings and the dummy-pillar openings with sacrificial material and there-after removing the sacrificial material from the channel openings and the dummy-pillar openings.

7. The method of claim 6 wherein,
the filling of the channel openings and the dummy-pillar openings with the sacrificial material occurs at the same time; and
the removing of the sacrificial material from the channel openings and the dummy-pillar openings occurs at different times.

8. The method of claim 7 wherein the removing of the sacrificial material from the channel openings occurs before the removing of the sacrificial material from the dummy-pillar openings.

9. The method of claim 8 comprising forming channel material of the operative channel-material strings in the channel openings before the removing of the sacrificial material from the dummy-pillar openings.

10. The method of claim 1 comprising forming and filling horizontally-elongated trenches in the vertical stack with intervening material to form laterally-spaced memory-block regions, said filling with intervening material occurring before forming the conducting material.

11. The method of claim 10 wherein said filling with intervening material occurs before forming the void space in individual of the first tiers.

12. The method of claim 1 wherein the vertical stack in a finished construction is formed to comprise:
a lower stack comprising vertically-alternating lower second tiers and lower first tiers, the lower stack comprising lower-laterally-spaced memory-block regions;
an upper stack directly above the lower stack, the upper stack comprising vertically-alternating upper second tiers and upper first tiers above the lower stack, the upper stack comprising upper-laterally-spaced memory-block regions that are directly above the lower-laterally-spaced memory-block regions;
the operative channel-material strings of the memory cells extending through the upper second tiers, the upper first tiers, the lower second tiers, and the lower first tiers; and
the dummy pillars extending through at least a majority of the upper second tiers, the upper first tiers, the lower second tiers, and the lower first tiers through which the operative channel-material strings extend.

13. The method of claim 12 comprising forming additional dummy pillars laterally-between and longitudinally-spaced-along immediately-laterally-adjacent of the upper and lower memory-block regions, the additional dummy pillars extending through at least a majority of the upper second tiers, the upper first tiers, the lower second tiers, and the lower first tiers through which the operative channel-material strings extend.

14. The method of claim 1 wherein forming the vertical stack comprises:
forming a lower stack comprising the vertically-alternating tiers;
forming a first portion of the individual dummy-pillar openings in the lower stack;
filling the first portion with a sacrificial material;
forming an upper stack directly above the lower stack;
forming a second portion of the individual dummy-pillar openings in the upper stack;
filling the second portion with the sacrificial material;
etching the sacrificial material from the both the first and second portions; and
forming the void space in the first tiers in the upper and lower stacks.

15. The method of claim 14 wherein the operative channel-material strings are formed after the upper stack is formed directly above the lower stack.

16. The method of claim 14 wherein forming the operative channel-material strings comprises:
forming a first portion of each of the operative channel-material strings in the lower stack before forming the upper stack directly above the lower stack; and
forming a second portion of each of the operative channel-material strings in the upper stack after forming the upper stack directly above the lower stack.

17. The method of claim 16 further comprising forming conductive plugs directly electrically coupled to the first portions of the operative channel-material strings before forming the upper stack directly above the lower stack, each of the second portions of the operative channel-material strings are directly electrically coupled to a respective one of the first portions through a respective one of the conductive plugs.

18. A method used in forming a memory array comprising strings of memory cells, comprising:
forming a stack comprising vertically-alternating first tiers and second tiers, the first tiers comprising sacrificial material;
forming dummy-pillar openings and channel openings through the second tiers, the first tiers, and the sacrificial material;
forming and filling horizontally-elongated trenches in the stack with intervening material to form laterally-spaced memory-block regions;
through the dummy-pillar openings, isotropically etching away and replacing the sacrificial material that is in the first tiers with conducting material of individual conductive lines in the memory-block regions; the etching and replacing occurring after the filling of the horizontally-elongated trenches with the intervening material;
after the replacing, forming a dummy pillar in individual of the dummy-pillar openings; and
forming an operative channel-material string of memory cells extending through the second tiers and the first tiers in individual of the channel openings.

19. The method of claim 18 comprising forming the operative channel-material strings before said forming and filling of the horizontally-elongated trenches.

20. The method of claim 18 wherein the sacrificial material is a first sacrificial material and further comprising:
filling the channel openings and the dummy-pillar openings with a second sacrificial material and there-after removing the second sacrificial material from the channel openings and the dummy-pillar openings.

* * * * *